(12) United States Patent
Shi et al.

(10) Patent No.: US 11,917,797 B2
(45) Date of Patent: Feb. 27, 2024

(54) INTEGRATED THERMAL-ELECTRICAL COMPONENT FOR POWER ELECTRONICS CONVERTERS

(71) Applicant: The Florida State University Research Foundation, Inc., Tallahassee, FL (US)

(72) Inventors: Yanjun Shi, Tallahassee, FL (US); Sam Yang, Tallahassee, FL (US)

(73) Assignee: The Florida State University Research Foundation, Inc., Tallahassee, FL (US)

( * ) Notice: Subject to any disclaimer, the term of this patent is extended or adjusted under 35 U.S.C. 154(b) by 602 days.

(21) Appl. No.: 17/110,628

(22) Filed: Dec. 3, 2020

(65) Prior Publication Data

US 2021/0168965 A1    Jun. 3, 2021

Related U.S. Application Data

(60) Provisional application No. 62/942,990, filed on Dec. 3, 2019.

(51) Int. Cl.
*H05K 7/20* (2006.01)
*H01G 4/01* (2006.01)
(Continued)

(52) U.S. Cl.
CPC ............... *H05K 7/209* (2013.01); *H01G 4/01* (2013.01); *H01L 23/3677* (2013.01);
(Continued)

(58) Field of Classification Search
CPC ... H01G 2/06; H01G 2/08; H01G 4/40; H01L 23/36; H01L 23/3677; H01L 23/50; H05K 7/209; H05K 7/14329
See application file for complete search history.

(56) References Cited

U.S. PATENT DOCUMENTS 3,993,125 A * 11/1976 Rhodes ................... F28F 1/128
165/153
5,021,927 A *  6/1991 Schweikert ............. H01G 2/08
361/514

(Continued)

OTHER PUBLICATIONS

US Department of Energy, Power America, available online at: https://www.energy.gov/eere/amo/power-america.

(Continued)

*Primary Examiner* — Timothy J Thompson
*Assistant Examiner* — Rhadames Alonzo Miller
(74) *Attorney, Agent, or Firm* — Meunier Carlin & Curfman LLC

(57) ABSTRACT

The disclosure relates to capacitive heatsink devices and systems. In one embodiment, the heat sink capacitor includes a positive (P) bus plate; a negative (N) bus plate; a first dielectric material; a second dielectric material; and a heat sink comprising a first side and a second side, the first side of the heat sink attached to the first dielectric material and the second dielectric material, wherein the first dielectric material and the second dielectric material are separated by a portion of the heat sink, wherein the first dielectric material electrically insulates the P bus plate from the first side of the heat sink to form a first capacitor, and wherein the second dielectric material electrically insulates the N bus plate from the first side of the heat sink to form a second capacitor.

20 Claims, 5 Drawing Sheets

(51) Int. Cl.
*H01L 23/367* (2006.01)
*H02M 7/00* (2006.01)
*H01G 4/12* (2006.01)

(52) U.S. Cl.
CPC ......... *H01G 4/1218* (2013.01); *H01G 4/1227* (2013.01); *H02M 7/003* (2013.01)

(56) References Cited

U.S. PATENT DOCUMENTS

| | | | | |
|---|---|---|---|---|
| 5,332,032 | A * | 7/1994 | Beddome | F28D 1/0341 165/78 |
| 5,373,418 | A * | 12/1994 | Hayasi | H01L 24/01 257/E23.084 |
| 5,773,362 | A * | 6/1998 | Tonti | H01L 24/32 438/665 |
| 5,811,868 | A * | 9/1998 | Bertin | H01L 28/40 257/532 |
| 5,930,115 | A * | 7/1999 | Tracy | H05K 7/20727 361/689 |
| 6,117,194 | A | 9/2000 | Strange et al. | |
| 6,236,103 | B1 | 5/2001 | Bernstein et al. | |
| 6,552,383 | B2 * | 4/2003 | Ahn | H01L 29/945 257/E21.018 |
| 6,982,481 | B1 * | 1/2006 | Sonderegger | H01L 23/4006 257/713 |
| 7,224,582 | B1 * | 5/2007 | Saturley | H05K 9/0049 361/679.54 |
| 7,836,942 | B2 * | 11/2010 | Cannas | F24H 1/43 165/181 |
| 9,620,890 | B1 * | 4/2017 | Vino, IV | G02B 6/4293 |
| 9,853,435 | B1 * | 12/2017 | Burkman | H01M 10/625 |
| 2005/0039884 | A1 * | 2/2005 | Pawlenko | F28F 3/02 257/E23.091 |
| 2005/0281001 | A1 * | 12/2005 | Dittus | H01L 23/4093 361/710 |
| 2008/0185132 | A1 * | 8/2008 | Cannas | F28F 1/16 165/163 |
| 2008/0186039 | A1 * | 8/2008 | Cannas | F28F 1/16 324/750.28 |
| 2008/0316709 | A1 * | 12/2008 | Kim | H01L 23/3677 361/704 |
| 2009/0279261 | A1 * | 11/2009 | Seynaeve | H05K 7/20454 361/704 |
| 2011/0058336 | A1 * | 3/2011 | Sundstrom | H05K 7/20436 361/710 |
| 2012/0211214 | A1 * | 8/2012 | Phan | H01L 23/3677 165/185 |
| 2012/0280376 | A1 * | 11/2012 | Do | H01L 23/49548 438/122 |
| 2013/0180697 | A1 * | 7/2013 | Chen | H01L 21/4882 165/185 |
| 2014/0286613 | A1 * | 9/2014 | Ito | G02B 6/4292 385/88 |
| 2016/0064873 | A1 * | 3/2016 | Bucher | H01R 13/6658 439/59 |
| 2017/0094830 | A1 * | 3/2017 | Bucher | H05K 7/20445 |
| 2017/0164511 | A1 * | 6/2017 | Bucher | G02B 6/4272 |
| 2017/0361717 | A1 * | 12/2017 | Qin | B60L 53/51 |
| 2017/0366038 | A1 * | 12/2017 | Qin | H02J 7/0068 |
| 2017/0366039 | A1 * | 12/2017 | Qin | H02J 7/0042 |
| 2018/0153030 | A1 * | 5/2018 | Viswanathan | H05K 1/185 |
| 2018/0228048 | A1 * | 8/2018 | Blösch | H05K 5/0217 |
| 2018/0259731 | A1 * | 9/2018 | Dupeux | G02B 6/4271 |
| 2018/0306482 | A1 * | 10/2018 | Ball | F25D 25/021 |
| 2019/0067151 | A1 * | 2/2019 | Chen | H01L 23/5387 |
| 2019/0230817 | A1 * | 7/2019 | Han | H05K 7/1401 |
| 2020/0067319 | A1 * | 2/2020 | Qin | H02J 7/143 |
| 2021/0084791 | A1 * | 3/2021 | Bucher | H05K 7/205 |
| 2021/0313900 | A1 * | 10/2021 | Rosado | H01L 23/473 |
| 2022/0030739 | A1 * | 1/2022 | Bucher | H05K 7/20472 |
| 2022/0077021 | A1 * | 3/2022 | Avenas | H01L 23/13 |
| 2022/0082771 | A1 * | 3/2022 | Galbraith | G02B 6/4269 |
| 2022/0201892 | A1 * | 6/2022 | Bohlländer | H02M 7/003 |
| 2022/0328411 | A1 * | 10/2022 | Or-Bach | H01L 27/092 |

OTHER PUBLICATIONS

R. M. Burkart and J. W. Kolar, "Comparative Life Cycle Cost Analysis of Si and SiC PV Converter Systems Based on Advanced η-ρ-σ Multiobjective Optimization Techniques," IEEE Transactions on Power Electronics, vol. 32, No. 6, pp. 4344-4358, Jun. 2017.

H. Akagi, T. Yamagishi, N. M. L. Tan, S. Kinouchi, Y. Miyazaki and M. Koyama, "Power-Loss Breakdown of a 750-V 100-kW 20-KHz Bidirectional Isolated DC-DC Converter Using SiC-MOSFET/SBD Dual Modules," IEEE Transactions on Industry Applications, vol. 51, No. 1, pp. 420-428, Jan.- Feb. 2015.

Y. Liu et al., "LCL Filter Design of a 50-kW 60-kHz SiC Inverter with Size and Thermal Considerations for Aerospace Applications," IEEE Transactions on Industrial Electronics, vol. 64, No. 10, pp. 8321-8333, Oct. 2017.

K. Park, F. D. Kieferndorf, U. Drofenik, S. Pettersson and F. Canales, "Weight Minimization of LCL Filters for High-Power Converters: Impact of PWM Method on Power Loss and Power Density," IEEE Transactions on Industry Applications, vol. 53, No. 3, pp. 2282-2296, May-Jun. 2017.

S. Peyghami, H. Wang, P. Davari and F. Blaabjerg, "Mission-Profile-Based System-Level Reliability Analysis in DC Microgrids," IEEE Transactions on Industry Applications, vol. 55, No. 5, pp. 5055-5067, Sep.-Oct. 2019.

H. Wang and H. Wang, "A Two-Terminal Active Capacitor," IEEE Transactions on Power Electronics, vol. 32, No. 8, pp. 5893-5896, Aug. 2017.

X. Lyu, N. Ren, Y. Li and D. Cao, "A SiC-Based High Power Density Single-Phase Inverter With In-Series and In-Parallel Power Decoupling Method," IEEE Journal of Emerging and Selected Topics in Power Electronics, vol. 4, No. 3, pp. 893-901, Sep. 2016.

Y. Ohnuma, K. Orikawa and J. Itoh, "A Single-Phase Current-Source PV Inverter With Power Decoupling Capability Using an Active Buffer," IEEE Transactions on Industry Applications, vol. 51, No. 1, pp. 531-538, Jan.- Feb. 2015.

Y. Shi, L. Wang, R. Xie and H. Li, "Design and implementation of a 100 kW SiC filter-less PV inverter with 5 kW/kg power density and 99.2% CEC efficiency," IEEE Applied Power Electronics Conference and Exposition (APEC), Mar. 2018, pp. 393-398.

Y. Shi, L. Wang and H. Li, "Stability Analysis and Grid Disturbance Rejection for a 60-kW SiC-Based Filterless Grid-Connected PV Inverter," IEEE Transactions on Industry Applications, vol. 54, No. 5, pp. 5025-5038, Sep.-Oct. 2018.

Z. Huang, Z. Liu, F. C. Lee and Q. Li, "Critical-Mode-Based Soft-Switching Modulation for High-Frequency Three-Phase Bidirectional AC-DC Converters," IEEE Transactions on Power Electronics, vol. 34, No. 4, pp. 3888-3898, Apr. 2019.

N. He, M. Chen, J. Wu, N. Zhu and D. Xu Ge, "20 kW Zero-Voltage-Switching SiC-MOSFET Grid Inverter with 300 kHz Switching Frequency," IEEE Transactions on Power Electronics, early access.

L. Wang, Y. Shi, Y. Shi, R. Xie and H. Li, "Ground Leakage Current Analysis and Suppression in a 60-kW 5-Level T-Type Transformerless SiC PV Inverter," IEEE Transactions on Power Electronics, vol. 33, No. 2, pp. 1271-1283, Feb. 2018.

C. Hou, C. Shih, P. Cheng and A. M. Hava, "Common-Mode Voltage Reduction Pulsewidth Modulation Techniques for Three-Phase Grid-Connected Converters," IEEE Transactions on Power Electronics, vol. 28, No. 4, pp. 1971-1979, Apr. 2013.

Y. C. Son and Seung-Ki Sul, "A new active common-mode EMI filter for PWM inverter," IEEE Transactions on Power Electronics, vol. 18, No. 6, pp. 1309-1314, Nov. 2003.

H. Zhang, L. Yang, S. Wang and J. Puukko, "Common-Mode EMI Noise Modeling and Reduction With Balance Technique for Three-Level Neutral Point Clamped Topology," IEEE Transactions on Industrial Electronics, vol. 64, No. 9, pp. 7563-7573, Sep. 2017.

(56) References Cited

OTHER PUBLICATIONS

Z. Liu Z. Huang F. C. Lee Q. Li "Digital-Based interleaving control for GaN-Based MHz CRM Totem-Pole PFC" IEEE Journal of Emerging and Selected Topics in Power Electronics, vol. 4 No. 3 pp. 808-814 Sep. 2016.

Y. Shi, Y. Zhang, L. Wang and H. Li, "Reduction of EMI Noise Due to Nonideal Interleaving in a 100 kW SiC PV Converter," IEEE Transactions on Power Electronics, vol. 34, No. 1, pp. 13-19, Jan. 2019.

J. Broughton, V. Smet, R.R. Tummala, and Y.K. Joshi, "Review of thermal packaging technologies for automotive power electronics for traction purposes," ASME Journal of Electronic Packaging, 140(4), p. 040801, 2018.

A. Bar-Cohen, J.J. Maurer, and D.H. Altman, "Embedded Cooling for Wide Bandgap Power Amplifiers: A Review," ASME Journal of Electronic Packaging, 141(4), 2019.

C.E. Green, V. Sahu, Y. Hu, Y.K. Joshi, and A.G. Fedorov, "Passive and Active Thermal Technologies: Modeling and Evaluation," Handbook of 3D Integration: Design, Test, and Thermal Management, 4, pp. 375-412, 2019.

Jansen, Ralph, et al. "Overview of NASA Electrified Aircraft Propulsion (EAP) Research for Large Subsonic Transports." 53rd AIAA/SAE/ASEE Joint Propulsion Conference. 2017.

Wang, Zhiqiang, et al. "A 50-kW air-cooled SiC inverter with 3-D printing enabled power module packaging structure and genetic algorithm optimized heatsinks." IEEE Transactions on Industry Applications 55.6 (2019): 6256-6265.

* cited by examiner

INTEGRATED THERMAL-ELECTRICAL COMPONENT FOR POWER ELECTRONICS CONVERTERS

CROSS REFERENCE TO RELATED APPLICATION

This application claims priority to and benefit of U.S. Provisional patent application Ser. No. 62/942,990 filed Dec. 3, 2019, which is fully incorporated by reference and made a part hereof.

BACKGROUND

Power electronic converters interface between energy sources and loads. In many sizes of power systems, power electronic converters can increase the controllability and flexibility of the system. The share of electricity flowing through power electronics is forecasted to increase from 30% in 2005 to 80% in 2030, increasing the demand for lighter, smaller, and more efficient converters. (1) A typical power converter includes active components, passive components, and a cooling component. The cooling component is sometimes a passive component, such as a heat sink.

As noted above, typical power converters include both active and passive components. Both active and passive components cause losses in the system. Advancements in power semiconductor technology have reduced the size, weight and power loss of active components in power converters. Today, in some power converters, passive components are approximately 30%-70% of the total weight of the converter, 30%-70% of the total volume of the converter, and cause 30%-40% of the power lost in the converter. (2)-(5) Examples of passive components include DC-link capacitors, differential mode filters, and common mode filters.

In some power converters, the DC-link capacitor is used to decouple the dynamics between the converter and its source. The DC-link capacitor may be a large component, and the failure of the DC-link capacitor can cause converter failure. Prior efforts have focused on replacing the DC-link capacitor with active components, however circuits with additional active components may increase the complexity and power loss of the system. (7)-(9)

In some power converters, a differential mode (DM) filter is implemented. The DM filter may be used to filter the high-frequency ripple at the output of the power converter. The DM filter may require customization to the converter design. The DM filter also contributes to the power losses, weight, and volume of the converter.

In some power converters, a common mode (CM) filter is implemented. The CM filter may be used to suppress unwanted interference in the CM path. This interference may be described as ground leakage current, bearing current, or CM noise. Control or modulation-based methods can reduce CM interference up to the switching frequency.

A passive CM filter may then be required to suppress the noise from the switching frequency to tens of MHz defined by the electromagnetic interference (EMI) standards. There are a variety of methods that can be employed to reduce the CM filter size such as adding an active circuit, creating a balancing circuit, or using high precision control combined with a passive circuit. (16)-(19) Generally a CM filter is required to comply with EMI standards due to the presence of parasitic capacitance.

Further, the power electronics cooling system may be responsible for about a third of the total converter weight, and multiple thermal resistances present between the hot spot and the cooling medium often inhibit the thermal performance and demand large heat transfer surface areas for proper heat dissipation. (10) In electronics cooling, thermal interface materials (TIMs) serve as thermal pastes that join the electronic devices to their respective heat sinks. Efforts to reduce the thermal resistance of a TIM may be limited by 1) the low thermal conductivity of electric insulation materials, and 2) contact resistance (air gap) between the baseplate and TIM. Direct cooling methods such as impinging jet and embedded microchannels have been proposed to address the thermal challenges related to TIMs, but these approaches may require intricate cooling infrastructure, high cost, and access to limited cutting-edge manufacturing technology. (20)-(22)

Therefore, what is needed are devices and systems implementing an integrated thermal-electrical component to solve above mentioned issues. In particular, devices and systems implementing an integrated thermal-electrical capacitor.

SUMMARY

In one aspect, the present disclosure relates to a heat sink capacitor. In one embodiment, the heat sink capacitor includes: a positive (P) bus, wherein the P bus is comprised of electrically conductive material; a negative (N) bus, wherein the N bus is comprised of electrically conductive material; a first dielectric material; a second dielectric material; and a heat sink comprising a first side and a second side, the first side of the heat sink attached to the first dielectric material and the second dielectric material, wherein the first dielectric material and the second dielectric material are separated by a portion of the heat sink, wherein the first dielectric material electrically insulates the P bus from the first side of the heat sink and the portion of the heat sink that separates the first dielectric material and the second dielectric material to form a first capacitor, and wherein the second dielectric material electrically insulates the N bus from the first side of the heat sink and the portion of the heat sink that separates the first dielectric material and the second dielectric material to form a second capacitor.

In one embodiment, the heat sink capacitor includes a printed circuit board; a circuit component attached to the printed circuit board, wherein the circuit component is electrically connected to at least one of the P bus or the N bus and the printed circuit board is separated from the P bus and the N bus by a non-conductive or a semiconductive material.

In one embodiment, the circuit component is a switching component.

In one embodiment, the switching component is a gallium nitride power transistor.

In one embodiment, the switching component is a silicon carbide power transistor.

In one embodiment, the P bus and/or the N bus each comprise a bus plate and are configured to maximize the surface area of each of the bus plates.

In one embodiment, the bus plates are each configured to include a plurality of fins.

In one embodiment, the first side of the heat sink is configured to maximize a surface area of the first side of the heat sink.

In one embodiment, the first side of the heat sink includes a plurality of fins.

In one embodiment, the first dielectric material and the second dielectric material are selected from the group consisting of $BaTiO_3$, barium strontium titanate, $SrTiO_3$, and $TiO_2$.

In one embodiment, the first dielectric material is not the same as the second dielectric material.

In one embodiment, one or both of the first dielectric material and the second dielectric material are $BaTiO_3$.

In one embodiment, the circuit component is a power semiconductor

In one embodiment, the second side of the heat sink comprises a pin-fin heat sink whose geometry could be plate-fin, porous, and dendritic.

In another aspect, the present disclosure relates to a power electronic converter system. In one embodiment, the system includes: a printed circuit board; a circuit component attached to the printed circuit board; and a heat sink capacitor, wherein the heat sink capacitor comprises: a positive (P) bus plate, wherein the P bus plate is comprised of electrically conductive material; a negative (N) bus plate, wherein the N bus is comprised of electrically conductive material; a first dielectric material; a second dielectric material; and a heat sink comprising a first side and a second side, the first side of the heat sink attached to the first dielectric material and the second dielectric material, wherein the first dielectric material and the second dielectric material are separated by a portion of the heat sink, wherein the first dielectric material electrically insulates the P bus plate from the first side of the heat sink and the portion of the heat sink that separates the first dielectric material and the second dielectric material to form a first capacitor, and wherein the second dielectric material electrically insulates the N bus plate from the first side of the heat sink and the portion of the heat sink that separates the first dielectric material and the second dielectric material to form a second capacitor.

In one embodiment, the circuit component of the power electronic converter system is a switching component.

In one embodiment, the switching component of the power electronic converter system is switched at a frequency of 1 MHz or greater.

In one embodiment, the switching component of the power electronic converter system is a gallium nitride power transistor.

In one embodiment, the first dielectric material and/or the second dielectric material of the power electronic converter system is selected from the group consisting of $BaTiO_3$, barium strontium titanate, $SrTiO_3$, and $TiO_2$.

In one embodiment, the first dielectric material of the power electronic converter system is not the same as the second dielectric material.

In one embodiment, the first dielectric material of the power electronic converter system and/or the second dielectric material is $BaTiO_3$.

In one embodiment, a capacitance of the heat sink capacitor of the power electronic converter system is sufficient for the heat sink capacitor to act as a DC-link capacitor for the power electronic converter.

In one embodiment, the P bus plate of the power electronic converter system is attached to a first switching component, and the N bus plate is attached to a second switching component, and the printed circuit board is separated from the P bus plate and the N bus plate by a non-conductive or a semiconductive material.

In one embodiment, the P bus plate of the power electronic converter system and/or the N bus plate are configured to maximize the surface area of each of the bus plates.

In one embodiment, each of the bus plates of the power electronic converter system are configured to include a plurality of fins.

In one embodiment, the first side of the heat sink of the power electronic converter system is configured to maximize a surface area of the first side of the heat sink.

In one embodiment, the first side of the heat sink of the power electronic converter system includes a plurality of fins.

In one embodiment, the circuit component of the power electronic converter system is a power semiconductor.

In one embodiment, the second side of the heat sink of the power electronic converter system includes a pin-fin heat sink whose geometry could be plate-fin, porous, and dendritic.

BRIEF DESCRIPTION OF THE DRAWINGS

The accompanying drawings, which are incorporated in and constitute a part of this specification, illustrate embodiments and together with the description, serve to explain the principles of the disclosed technology.

DETAILED DESCRIPTION

Figure 1A:
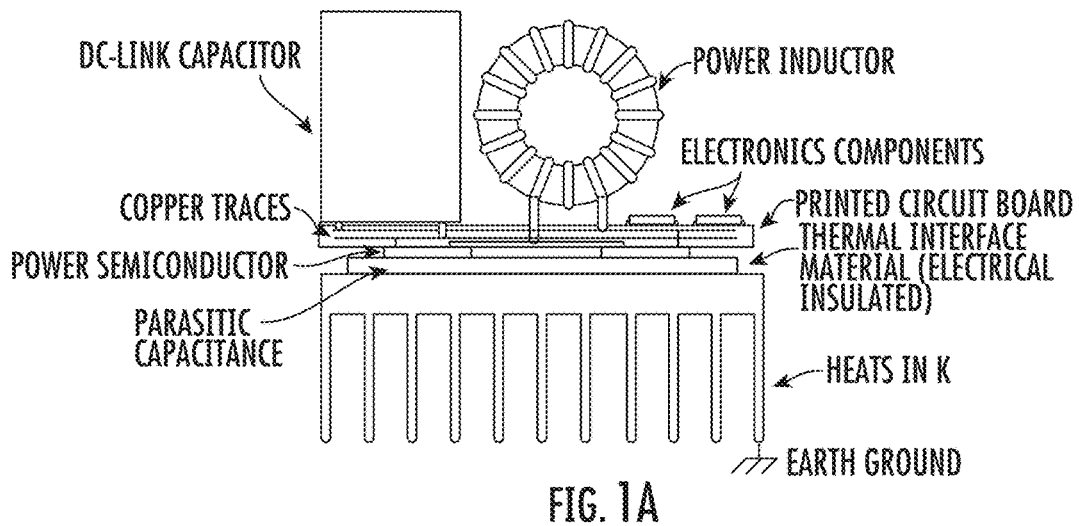
FIGS. 1A-1F are illustrations comparing a conventional power converter with a power converter that uses integrated thermal/electrical components, including circuit schematics and equivalent circuits of the respective converters.

Before the present methods and systems are disclosed and described, it is to be understood that the methods and systems are not limited to specific synthetic methods, specific components, or to particular compositions. It is also to be understood that the terminology used herein is for the purpose of describing particular embodiments only and is not intended to be limiting.

As used in the specification and the appended claims, the singular forms "a," "an" and "the" include plural referents unless the context clearly dictates otherwise. Ranges may be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

"Optional" or "optionally" means that the subsequently described event or circumstance may or may not occur, and that the description includes instances where said event or circumstance occurs and instances where it does not.

Throughout the description and claims of this specification, the word "comprise" and variations of the word, such as "comprising" and "comprises," means "including but not limited to," and is not intended to exclude, for example, other additives, components, integers or steps. "Exemplary" means "an example of" and is not intended to convey an indication of a preferred or ideal embodiment. "Such as" is not used in a restrictive sense, but for explanatory purposes.

Disclosed are components that can be used to perform the disclosed methods and systems. These and other components are disclosed herein, and it is understood that when combinations, subsets, interactions, groups, etc. of these components are disclosed that while specific reference of each various individual and collective combinations and permutation of these may not be explicitly disclosed, each is specifically contemplated and described herein, for all methods and systems. This applies to all aspects of this application including, but not limited to, steps in disclosed methods. Thus, if there are a variety of additional steps that can be performed it is understood that each of these additional steps can be performed with any specific embodiment or combination of embodiments of the disclosed methods.

Some references, which may include various patents, patent applications, and publications, are cited in a reference list and discussed in the disclosure provided herein. The citation and/or discussion of such references is provided merely to clarify the description of the present disclosure and is not an admission that any such reference is "prior art" to any aspects of the present disclosure described herein. In terms of notation, "(n)" corresponds to the $n^{th}$ reference in the list. For example, (3) refers to the $3^{rd}$ reference in the list, namely H. Akagi, T. Yamagishi, N. M. L. Tan, S. Kinouchi, Y. Miyazaki and M. Koyama, "Power-Loss Breakdown of a 750-V 100-kW 20-kHz Bidirectional Isolated DC-DC Converter Using SiC-MOSFET/SBD Dual Modules," IEEE Transactions on Industry Applications, vol. 51, no. 1, pp. 420-428, January-February 2015. All references cited and discussed in this specification are incorporated herein by reference in their entireties and to the same extent as if each reference was individually incorporated by reference.

The present methods and systems may be understood more readily by reference to the following detailed description of preferred embodiments and the Examples included therein and to the Figures and their previous and following description.

Figure 1B:
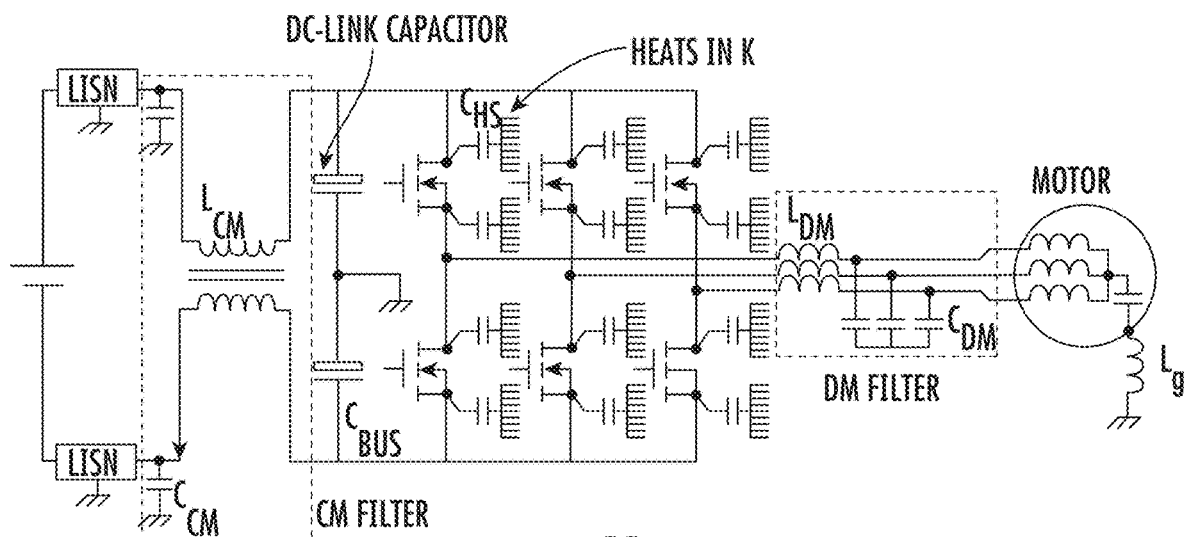
Figure 1C:
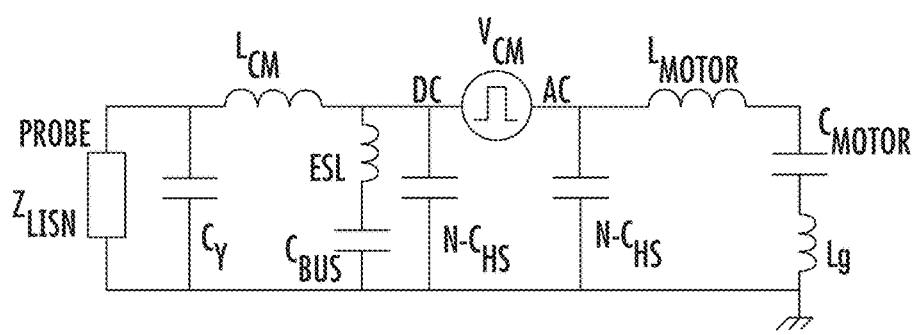

FIGS. 1A-1F are a comparison of a conventional power converter with a power converter that uses integrated thermal and electrical components, including circuit schematics and equivalent circuits. FIGS. 1A-1C depict a conventional power converter. The heat sink of the conventional power converter is electrically insulated from the power semiconductors. To achieve electrical insulation and thermal conductance, a layer of thermal interface material (TIM) is be placed between the heat sink baseplate and power semiconductor. This type of structure may cause a steep temperature gradient across the TIM, and may also induce parasitic capacitance between power semiconductors and ground (because the heat sink is typically grounded). The conventional structure therefore may include a short path for common mode (CM) electromagnetic interference (EMI) noise and result in switching losses.

Figure 1D:
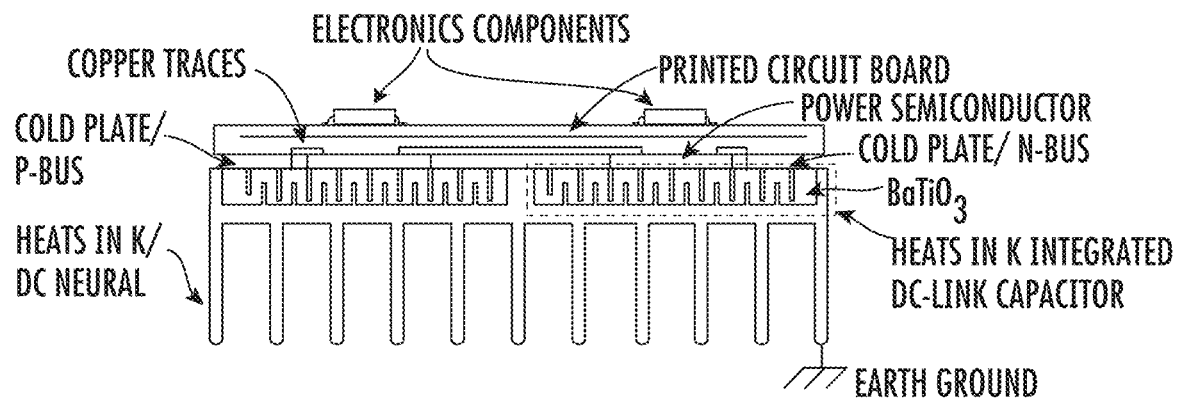
Figure 1E:
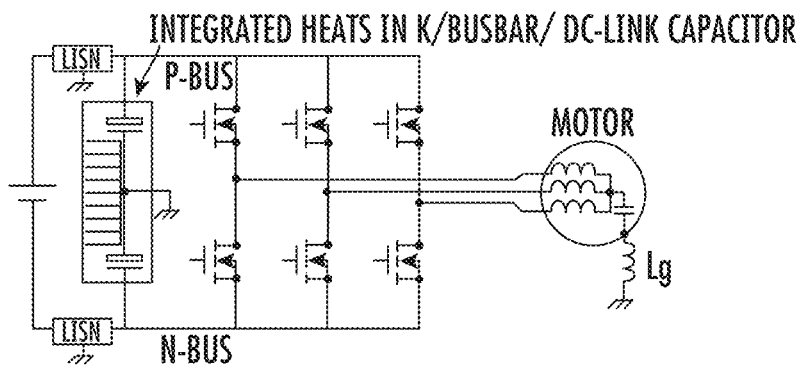
Figure 1F:
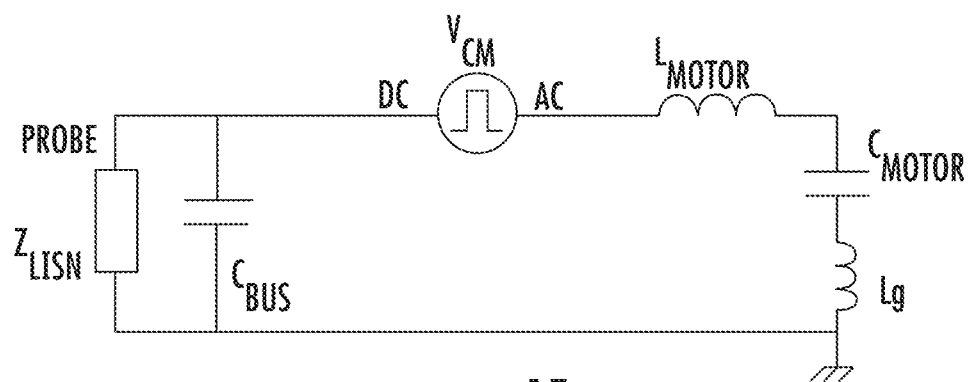

In the embodiment shown in FIGS. 1D-1F, the integrated thermal and electrical component is a heat sink capacitor (CapSink). With reference to the box labelled "Proposed Power Converter with Integrated Thermal/Electrical Components," some embodiments of the disclosed device eliminate the common mode and differential mode (DM) filter capacitors. In these embodiments, the DC-link capacitor may be considered to be the CapSink.

Further, in some embodiments, no thermal interface material is required to join the exemplary power semiconductor or other circuit component to the heat sink. If no thermal interface material is used, the size of the heat sink may be further reduced. Additionally, without thermal interface material, the parasitic capacitance of the heat sink is eliminated. In a conventional electrical converter, a parasitic capacitance exists due to the configuration of heat sink and thermal interface material. This parasitic capacitance may be characterized as a low-impedance path at operational frequencies. In some embodiments where the thermal interface material has been removed, the grounding impedance and motor impedance can be used to suppress CM noise and eliminate the requirement for a CM filter.

Similarly, in some configurations of a power converter using a CapSink, the DM inductance is on the order of μH. The DM inductance therefore may be significantly smaller than the inductance of the load (such as a motor) and the cable connecting the load to the converter. Therefore, the DM filter may also be eliminated from the power converter in some embodiments of a CapSink power converter.

With reference to FIG. 1D, the integrated heat sink/busbar/DC-link capacitor reduces the complexity of the exemplary power converter. In some embodiments, the heat sink baseplate may be divided into three parts as shown in FIGS. 1D and 1E: P bus, N bus, and Neutral. The P bus, N bus and Neutral are insulated from the heat sink by a dielectric material. Switching components may be attached to the N bus plate and P bus plate. In the embodiment shown in FIGS. 1D-1F, the dielectric material is Barium Titanate ($BaTiO_3$) base ceramic material. The neutral may comprise the main heat sink structure while the P bus and N bus may be part of heat sink baseplate and DC busbar. A plate-pin shaped aluminum structure between P bus, Neutral, and N bus may function as the electrodes of the two integrated capacitors. The dielectric strength of $BaTiO_3$ allows a large number of fins to be inserted for an increased overlapping area, and the permittivity of $BaTiO_3$ yields 100 μF-level capacitance without further increasing the heat sink size. The use of dielectric materials other than $BaTiO_3$ is contemplated to obtain different thermal and electrical characteristics in other embodiments. The conventional power converter circuit schematic (FIG. 1B) uses DC-link capacitors separate from the heat sink, resulting in a more complicated power converter design.

In a non-limiting example, the power semiconductors are soldered directly onto the baseplate. Since (1) the temperature rise between the power semiconductor and the baseplate is negligible; (2) the surface area between the baseplate and $BaTiO_3$ is significantly larger; and (3) $BaTiO_3$ exhibits relatively high thermal conductivity compared to conventional TIMs, the proposed design can achieve higher heat transfer than TIM-based structures. Further, in some embodiments, the parasitic CM capacitors are eliminated as the power semiconductors are no longer insulated from the heat sink.

With reference to the common mode equivalent circuit of both the conventional power converter (FIG. 1C) and an embodiment of the disclosed power converter (FIG. 1F), the embodiment of the disclosed power converter can be represented by a simpler common mode equivalent circuit. The simpler common mode equivalent circuit representing a power converter implementing a CapSink eliminates some components of the conventional power converter. In some embodiments, the capacitance of the heatsink capacitor is sufficient for the heat sink capacitor to act as a DC-link capacitor for a power electronic converter.

Figure 2:
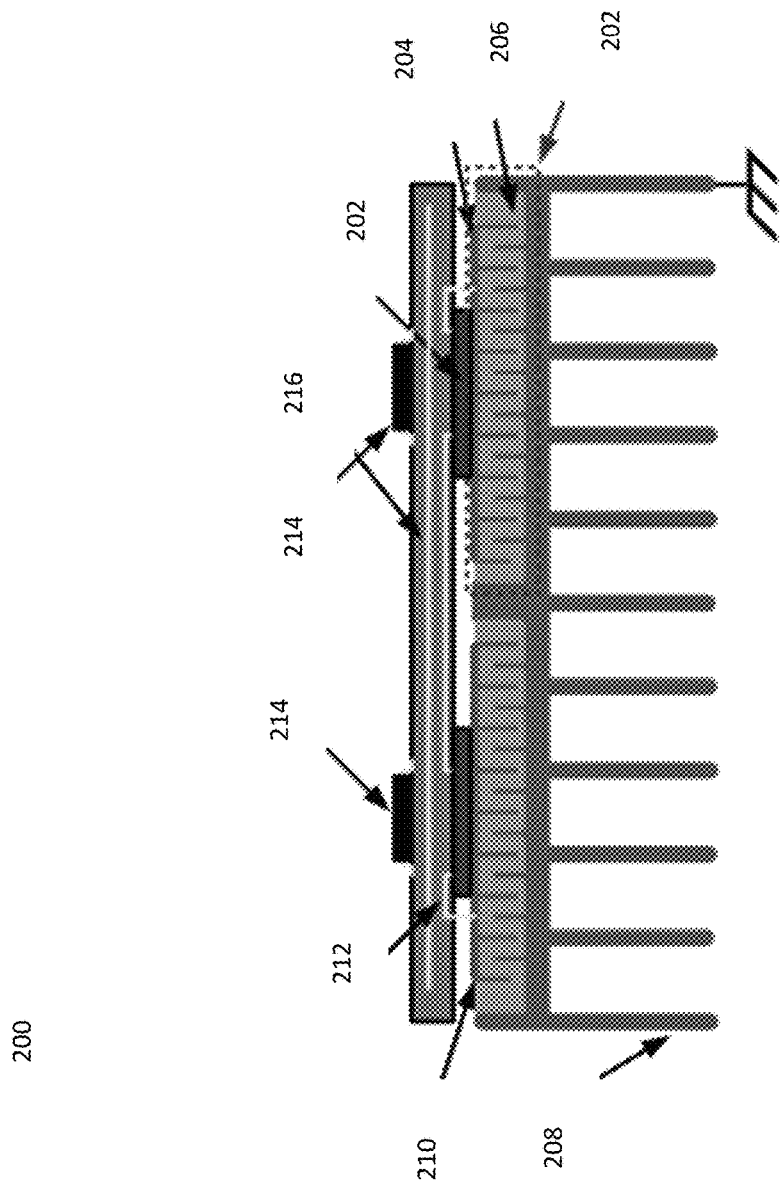
FIG. 2 is a cross-sectional view of a power converter incorporating a capacitive heat sink (CapSink) structure.

FIG. 2 depicts the mechanical structure of a power converter 200 including a CapSink. The structure of a heat sink integrated DC-link capacitor 202 includes an N bus plate 204, which is connected to a dielectric material 206 that electrically insulates the heat sink 208 from the N bus plate 204. Similarly, the P bus plate 210 is insulated from the heat sink 208 with dielectric material 207. The dielectric materials 206 207 may be $BaTiO_3$ or other dielectric materials including barium strontium titanate, $SrTiO_3$, and $TiO_2$. Additionally, the dielectric materials 206 207 may be different materials. The dielectric materials 206 207 may be separated by a portion of the heat sink 208. Electrical traces 212 may electrically connect the power semiconductor 212 to the N bus plate 204 and P bus plate 210. Other circuit components 214 not joined to the CapSink may be placed on the printed circuit board 216. The N bus and P bus may include fins and other geometries to alter the electrical and thermal characteristics of the CapSink. The heat sink 208 may be designed to maximize the surface area of the heat sink 208. The N bus plate and P bus plate may also be designed to maximize the surface areas of the N bus plate and P bus plate.

Figure 3:
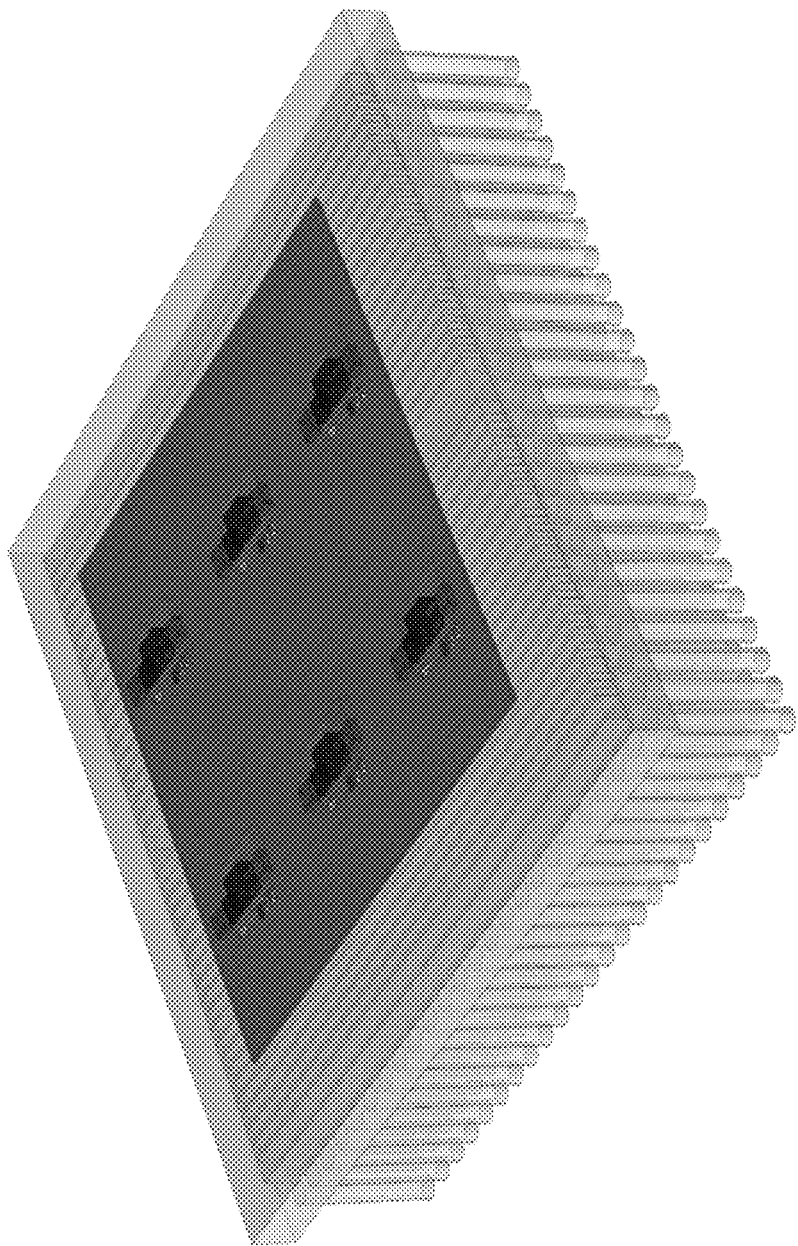
FIG. 3 is an illustration of an implementation of the disclosed CapSink structure in an embodiment incorporating a pin fin heat sink.

FIG. 3 illustrates the mechanical design of a non-limiting example of a converter system configured to implement a CapSink. The embodiment illustrated in FIG. 3 is a high power-density propulsion inverter. The bottom surface of the power converter depicted in FIG. 3 is a heat sink, while the top surface depicts a power converter circuit implementing a CapSink. The heat sink design may be a pin-fin design, plate-fin design, dendritic, porous, or any other geometry. The specifications of the proposed embodiment are detailed in Table 1. The embodiment described in Table 1 and illustrated in FIG. 3 uses Gallium Nitride (GaN) power transistors with MHz-level switching frequency because GaN transistors have lower turn-off switching loss than turn-on loss. However, different embodiments may use other transistor compositions and technologies, or other switching devices. For example, in some embodiments the switching component is a silicon carbide power transistor. Additionally, the embodiment described in Table 1 is configured to apply variable frequency modulation and ensure zero-current switching (ZCS) at the whole fundamental period. Embodiments implementing ZCS have zero-current turn-on, but increased turn-off current. Therefore, in some embodiments implementing ZCS, the switching loss will be significantly reduced. Furthermore, the embodiment described in Table 1 and illustrated in FIG. 3 does not require any magnetic components or electrolytic capacitors due to the configuration of the CapSink. Alternative embodiments implementing different switching durations and frequencies are also possible.

TABLE 1

| Power Rating | 30 kW | DC-link cap | 47 µF |
|---|---|---|---|
| Efficiency @1 MHz | 99.3% @50% load 99.0% @100% load | Cooling Method | Air Cooled |
| Input Voltage | 416 Vdc-525 Vdc | Target junction temperature | <90 C. |
| Output Voltage | 270 Vac l-l | Heat sink thermal resistance | 0.08 C./W |
| Fundamental frequency | 2000 Hz | Heat sink mass | 600 g |
| Switching frequency | ~1 MHz | Total mass | <800 g |
| Circuit Topology | Interleaved three phase; Zero current turn-on | Power Density | >60 kW/L >37 kW/kg |

Figure 4:
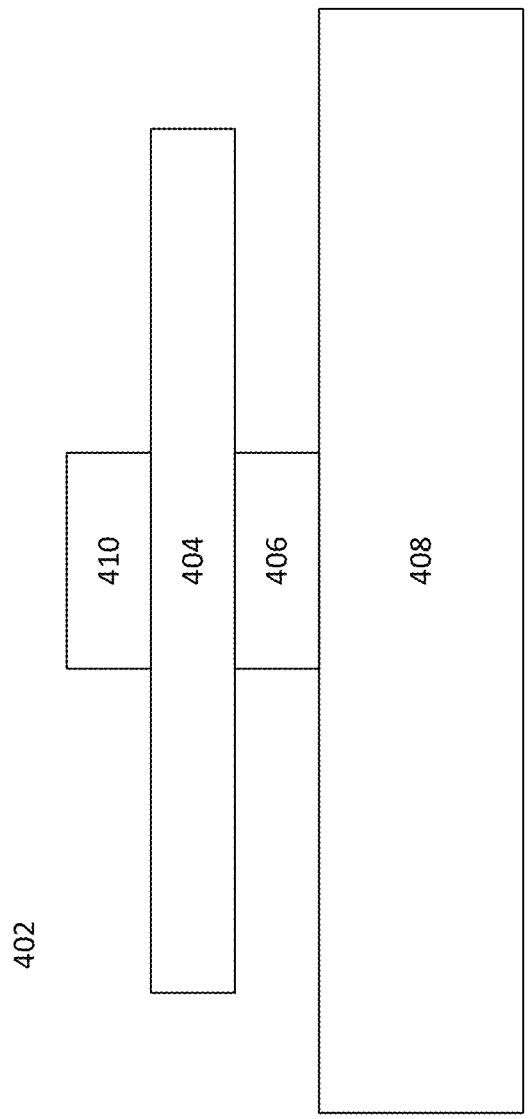
FIG. 4 is block diagram of an integrated thermal/electrical component.

FIG. 4 depicts a block diagram overview of the basic structure of an integrated thermal and electrical capacitor 402. A bus 404 is joined to a dielectric material 406, which in turn is connected to a heat sink 408. The bus 404 is connected to a circuit component 410. Both the bus 404 and circuit component 410 are electrically isolated from the heat sink 408 by the dielectric 406. The heat sink 408, the bus 404 and the dielectric material 406 may be configured in different geometries to optimize different thermal and electrical properties. These geometries include configurations of fins, pins, and other shapes.

While the methods and systems have been described in connection with preferred embodiments and specific examples, it is not intended that the scope be limited to the particular embodiments set forth, as the embodiments herein are intended in all respects to be illustrative rather than restrictive.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that an order be inferred, in any respect. This holds for any possible non-express basis for interpretation, including: matters of logic with respect to arrangement of steps or operational flow; plain meaning derived from grammatical organization or punctuation; the number or type of embodiments described in the specification.

Throughout this application, various publications may be referenced. The disclosures of these publications in their entireties are hereby incorporated by reference into this application in order to more fully describe the state of the art to which the methods and systems pertain.

It will be apparent to those skilled in the art that various modifications and variations can be made without departing from the scope or spirit. Other embodiments will be apparent to those skilled in the art from consideration of the specification and practice disclosed herein. It is intended that the specification and examples be considered as exemplary only, with a true scope and spirit being indicated by the following claims.

LIST OF REFERENCES

Unless otherwise indicated, each of the following are fully incorporated by reference and made a part hereof:

[1] US Department of Energy, Power America, available online at: https://www.energy.gov/eere/amo/power-america.

[2] R. M. Burkart and J. W. Kolar, "Comparative Life Cycle Cost Analysis of Si and SiC PV Converter Systems Based on Advanced η-ρ-σMultiobjective Optimization Techniques," IEEE Transactions on Power Electronics, vol. 32, no. 6, pp. 4344-4358, June 2017.

[3] H. Akagi, T. Yamagishi, N. M. L. Tan, S. Kinouchi, Y. Miyazaki and M. Koyama, "Power-Loss Breakdown of a 750-V 100-kW 20-kHz Bidirectional Isolated DC-DC Converter Using SiC-MOSFET/SBD Dual Modules," IEEE Transactions on Industry Applications, vol. 51, no. 1, pp. 420-428, January-February 2015.

[4] Y. Liu et al., "LCL Filter Design of a 50-kW 60-kHz SiC Inverter with Size and Thermal Considerations for Aerospace Applications," IEEE Transactions on Industrial Electronics, vol. 64, no. 10, pp. 8321-8333, October 2017.

[5] K. Park, F. D. Kieferndorf, U. Drofenik, S. Pettersson and F. Canales, "Weight Minimization of LCL Filters for High-Power Converters: Impact of PWM Method on Power Loss and Power Density," IEEE Transactions on Industry Applications, vol. 53, no. 3, pp. 2282-2296, May-June 2017.

[6] S. Peyghami, H. Wang, P. Davari and F. Blaabjerg, "Mission-Profile-Based System-Level Reliability Analysis in DC Microgrids," IEEE Transactions on Industry Applications, vol. 55, no. 5, pp. 5055-5067, September-October 2019.

[7] H. Wang and H. Wang, "A Two-Terminal Active Capacitor," IEEE Transactions on Power Electronics, vol. 32, no. 8, pp. 5893-5896, August 2017.

[8] X. Lyu, N. Ren, Y. Li and D. Cao, "A SiC-Based High Power Density Single-Phase Inverter With In-Series and In-Parallel Power Decoupling Method," IEEE Journal of Emerging and Selected Topics in Power Electronics, vol. 4, no. 3, pp. 893-901, September 2016.

[9] Y. Ohnuma, K. Orikawa and J. Itoh, "A Single-Phase Current-Source PV Inverter With Power Decoupling Capability Using an Active Buffer," IEEE Transactions on Industry Applications, vol. 51, no. 1, pp. 531-538, January-February 2015.

[10] Y. Shi, L. Wang, R. Xie and H. Li, "Design and implementation of a 100 kW SiC filter-less PV inverter with 5 kW/kg power density and 99.2% CEC efficiency," IEEE Applied Power Electronics Conference and Exposition (APEC), March 2018, pp. 393-398.

[11] Y. Shi, L. Wang and H. Li, "Stability Analysis and Grid Disturbance Rejection for a 60-kW SiC-Based Filterless Grid-Connected PV Inverter," IEEE Transactions on Industry Applications, vol. 54, no. 5, pp. 5025-5038, September-October 2018.

[12] Z. Huang, Z. Liu, F. C. Lee and Q. Li, "Critical-Mode-Based Soft-Switching Modulation for High-Frequency Three-Phase Bidirectional AC-DC Converters," IEEE Transactions on Power Electronics, vol. 34, no. 4, pp. 3888-3898, April 2019.

[13] N. He, M. Chen, J. Wu, N. Zhu and D. Xu Ge, "20 kW Zero-Voltage-Switching SiC-MOSFET Grid Inverter with 300 kHz Switching Frequency," IEEE Transactions on Power Electronics, early access.

[14] L. Wang, Y. Shi, Y. Shi, R. Xie and H. Li, "Ground Leakage Current Analysis and Suppression in a 60-kW 5-Level T-Type Transformerless SiC PV Inverter," IEEE Transactions on Power Electronics, vol. 33, no. 2, pp. 1271-1283, February 2018.

[15] C. Hou, C. Shih, P. Cheng and A. M. Hava, "Common-Mode Voltage Reduction Pulsewidth Modulation Techniques for Three-Phase Grid-Connected Converters," IEEE Transactions on Power Electronics, vol. 28, no. 4, pp. 1971-1979, April 2013.

[16] Y. C. Son and Seung-Ki Sul, "A new active common-mode EMI filter for PWM inverter," IEEE Transactions on Power Electronics, vol. 18, no. 6, pp. 1309-1314, November 2003.

[17] H. Zhang, L. Yang, S. Wang and J. Puukko, "Common-Mode EMI Noise Modeling and Reduction With Balance Technique for Three-Level Neutral Point Clamped Topology," IEEE Transactions on Industrial Electronics, vol. 64, no. 9, pp. 7563-7573, September 2017.

[18] Z. Liu Z. Huang F. C. Lee Q. Li "Digital-Based interleaving control for GaN-Based MHz CRM Totem-Pole PFC" IEEE Journal of Emerging and Selected Topics in Power Electronics, vol. 4 no. 3 pp. 808-814 September 2016.

[19] Y. Shi, Y. Zhang, L. Wang and H. Li, "Reduction of EMI Noise Due to Nonideal Interleaving in a 100 kW SiC PV Converter," IEEE Transactions on Power Electronics, vol. 34, no. 1, pp. 13-19, January 2019.

[20] J. Broughton, V. Smet, R. R. Tummala, and Y. K. Joshi, "Review of thermal packaging technologies for automotive power electronics for traction purposes," ASME Journal of Electronic Packaging, 140(4), p. 040801, 2018.

[21] A. Bar-Cohen, J. J. Maurer, and D. H. Altman, "Embedded Cooling for Wide Bandgap Power Amplifiers: A Review," ASME Journal of Electronic Packaging, 141(4), 2019.

[22] C. E. Green, V. Sahu, Y. Hu, Y. K. Joshi, and A. G. Fedorov, "Passive and Active Thermal Technologies: Modeling and Evaluation," Handbook of 3D Integration: Design, Test, and Thermal Management, 4, pp. 375-412, 2019.

[23] Jansen, Ralph, et al. "Overview of NASA Electrified Aircraft Propulsion (EAP) Research for Large Subsonic Transports." 53rd AIAA/SAE/ASEE Joint Propulsion Conference. 2017.

[24] Z. J. Wang, M. Chinthavali, S. Campbell, T. Wu and B. Ozpineci, "A 50-kW Air-Cooled SiC Inverter with 3D-Printing Enabled Power Module Packaging Structure and Genetic Algorithm Optimized Heatsinks," IEEE Transactions on Industry Applications, early access.

What is claimed is:

1. A heat sink capacitor, the heat sink capacitor comprising:
a positive (P) bus, wherein the P bus is comprised of electrically conductive material;
a negative (N) bus, wherein the N bus is comprised of electrically conductive material;
a first dielectric material;
a second dielectric material; and
a heat sink comprising a first side and a second side, the first side of the heat sink attached to the first dielectric material and the second dielectric material, wherein the first dielectric material and the second dielectric material are separated by a portion of the heat sink, wherein the first dielectric material electrically insulates the P bus from the first side of the heat sink and the portion of the heat sink that separates the first dielectric material and the second dielectric material to form a first capacitor, and wherein the second dielectric material electrically insulates the N bus from the first side of the heat sink and the portion of the heat sink that separates the first dielectric material and the second dielectric material to form a second capacitor.

2. The heat sink capacitor of claim 1, further comprising:
a printed circuit board;
a circuit component attached to the printed circuit board, wherein the circuit component is electrically connected to at least one of the P bus or the N bus and the printed circuit board is separated from the P bus and the N bus by a non-conductive or a semiconductive material.

3. The heat sink capacitor of claim 2, wherein the circuit component is a switching component, and the switching component comprises a gallium nitride power transistor or a silicon carbide power transistor.

4. The heat sink capacitor of claim 1, wherein the P bus and/or the N bus each comprise a bus plate and are configured to maximize a surface area of each of the bus plates, wherein the bus plates are each configured to include a plurality of fins.

5. The heat sink capacitor of claim 1, wherein the first side of the heat sink is configured to maximize a surface area of the first side of the heat sink, wherein the first side of the heat sink includes a plurality of fins.

6. The heat sink capacitor of claim 1, wherein the first dielectric material and the second dielectric material are selected from the group consisting of $BaTiO_3$, barium strontium titanate, $SrTiO_3$, and $TiO_2$.

7. The heat sink capacitor of claim 6, wherein the first dielectric material is not the same as the second dielectric material.

8. The heat sink capacitor of claim 2, wherein the circuit component is a power semiconductor.

9. The heat sink capacitor of claim 1, wherein the second side of the heat sink comprises a pin-fin heat sink whose geometry could be plate-fin, porous, and dendritic.

10. A power electronic converter system, the system comprising:
a printed circuit board;
a circuit component attached to the printed circuit board; and
a heat sink capacitor, wherein the heat sink capacitor comprises:
a positive (P) bus plate, wherein the P bus plate is comprised of electrically conductive material;
a negative (N) bus plate, wherein the N bus is comprised of electrically conductive material;
a first dielectric material;
a second dielectric material; and
a heat sink comprising a first side and a second side, the first side of the heat sink attached to the first dielectric material and the second dielectric material, wherein the first dielectric material and the second dielectric material are separated by a portion of the heat sink, wherein the first dielectric material electrically insulates the P bus plate from the first side of the heat sink and the portion of the heat sink that separates the first dielectric material and the second dielectric material to form a first capacitor, and wherein the second dielectric material electrically insulates the N bus plate from the first side of the heat sink and the portion of the heat sink that separates the first dielectric material and the second dielectric material to form a second capacitor.

11. The system of claim 10, wherein the first dielectric material and/or the second dielectric material is selected from the group consisting of $BaTiO_3$, barium strontium titanate, $SrTiO_3$, and $TiO_2$.

12. The system of claim 11, wherein the circuit component is a switching component that is switched at a frequency of 1 MHz or greater.

13. The system of claim 12, wherein the switching component is a gallium nitride power transistor.

14. The system of claim 11, wherein the first dielectric material is not the same as the second dielectric material.

15. The system of claim 10, wherein a capacitance of the heat sink capacitor is sufficient for the heat sink capacitor to act as a DC-link capacitor for the power electronic converter.

16. The system of claim 10, wherein the P bus plate is attached to a first switching component, and the N bus plate is attached to a second switching component, and the printed circuit board is separated from the P bus plate and the N bus plate by a non-conductive or a semiconductive material.

17. The system of claim 10, wherein the P bus plate and/or the N bus plate are configured to maximize a surface area of each of the bus plates, wherein each of the bus plates are configured to include a plurality of fins.

18. The system of claim 10, wherein the first side of the heat sink is configured to maximize a surface area of the first side of the heat sink, wherein the first side of the heat sink includes a plurality of fins.

19. The system of claim 10, wherein the circuit component is a power semiconductor.

20. The system of claim 10, wherein the second side of the heat sink comprises a pin-fin heat sink whose geometry could be plate-fin, porous, and dendritic.

* * * * *